United States Patent [19]

Koike

[11] Patent Number: 5,065,698

[45] Date of Patent: Nov. 19, 1991

[54] FILM FORMING APPARATUS CAPABLE OF PREVENTING ADHESION OF FILM DEPOSITS

[75] Inventor: Atsushi Koike, Chiba, Japan

[73] Assignee: Canon Kabushiki Kaisha, Tokyo, Japan

[21] Appl. No.: 674,314

[22] Filed: Mar. 25, 1991

Related U.S. Application Data

[63] Continuation of Ser. No. 337,312, Apr. 13, 1989, abandoned.

[30] Foreign Application Priority Data

Apr. 11, 1988 [JP] Japan ................... 63-90407
Apr. 11, 1989 [JP] Japan ................... 1-91633

[51] Int. Cl.$^5$ .............................................. C23C 16/00
[52] U.S. Cl. ................... 118/719; 118/715; 118/724; 118/733; 204/298.11; 204/298.25
[58] Field of Search ............. 118/715, 719, 724, 733; 156/345, 646; 204/192.1, 298.11, 298.25; 414/217

[56] References Cited

U.S. PATENT DOCUMENTS

| 3,656,454 | 4/1972 | Schrader | 118/733 |
| 4,666,734 | 5/1987 | Kamiya et al. | 118/719 |
| 4,696,833 | 9/1987 | Monnig et al. | 118/728 |
| 4,699,805 | 10/1987 | Seelbach et al. | 118/715 |
| 4,763,602 | 8/1988 | Madan et al. | 118/719 |
| 4,824,545 | 4/1989 | Arnold et al. | 118/719 |
| 4,825,808 | 5/1989 | Takahashi et al. | 118/715 |

FOREIGN PATENT DOCUMENTS

| 60-221572 | 11/1985 | Japan | 118/719 |
| 61-119672 | 6/1986 | Japan | 118/719 |
| 61-231166 | 10/1986 | Japan | 118/719 |
| 62-128518 | 6/1987 | Japan | 118/715 |
| 62-176986 | 8/1987 | Japan | 118/719 |
| 63-157870 | 6/1988 | Japan | 118/715 |

Primary Examiner—Shrive Beck
Assistant Examiner—Terry J. Owens
Attorney, Agent, or Firm—Fitzpatrick, Cella, Harper & Scinto

[57] ABSTRACT

A film forming apparatus for forming a film on a substrate set inside a film forming chamber capable of being evacuated comprises; a film forming chanber in which a film is formed on a substrate; a deposit shield member to prevent deposits from being adhered on the inner wall surface of the film forming chamber; a vacuum chamber capable of being evacuated and in which the deposit shield member is changed for new one; an open-shut device provided between the vacuum chamber and the film forming chamber, to keep airtightness between the vacuum chamber and the film forming chamber; and a carrying device to carry the deposit shield member between the vacuum chamber and the film forming chamber.

7 Claims, 7 Drawing Sheets

FIG. 7A
CHANGE IN REFRACTIVE INDEX OF $Si_3N_4$ FILM

FIG. 7B
CHANGE IN CURIE TEMPERATURE OF Tb-Fe-Co ALLOY FILM

FIG. 8

FILM FORMING APPARATUS CAPABLE OF PREVENTING ADHESION OF FILM DEPOSITS

This application is a continuation of application Ser. No. 07/337,312 filed Apr. 13, 1989, now abandoned.

BACKGROUND OF THE INVENTION

1. Field of the Invention

The present invention relates to a film forming apparatus and a film forming method.

2. Related Background Art

In forming films of, for example, metals, alloys, polymers and ceramics on substrates, physical vapor deposition (PVD) as exemplified by sputtering and evaporation and chemical vapor deposition (CVD) energy such as electrical discharge, heat or light have been hitherto usually utilized.

When films are formed using these processes, deposits, which are produced by deposition of a film forming material, can not be perfectly prevented from being formed on the surface of an inner wall of a film forming chamber in addition to the authorized formation of films on the substrates. Such deposits increase in thickness each time the film formation is repeated, and tend to cause film peel-off because of their own internal stress when they reach to a certain thickness. This film peel-off generates fine dust in the film forming chamber (i.e., dusting), so that the film in the course of formation attracts the above fine dust causing a lowering of the film quality because of the formation of spherical protuberances or the like.

To prevent this dusting, there is a method in which the deposits formed on the inner wall of a film forming chamber are removed by etching or the like after the film formation is completed (Japanese Unexamined Patent Publication (Kokai) No. 59-142839 (1984)). There is another method in which a film forming chamber is equipped in its inside with plate-like materials, called deposit shield plates, capable of preventing the deposits from being formed on the inner wall surface of the film forming chamber (Kobayashi et al., "SHINKU (Vacuum)", Vol. 28, No. 5, pp. 184–186, 1985).

However, the method in which the deposits are removed by etching or the like has had the problems, for example, in that it shortens the life of apparatus depending on what kind of material is used in the members disposed inside the film forming chamber, it is difficult to ascertain the completion of the removal of deposits, and it takes a long time for removal of the deposits.

Figure 1:
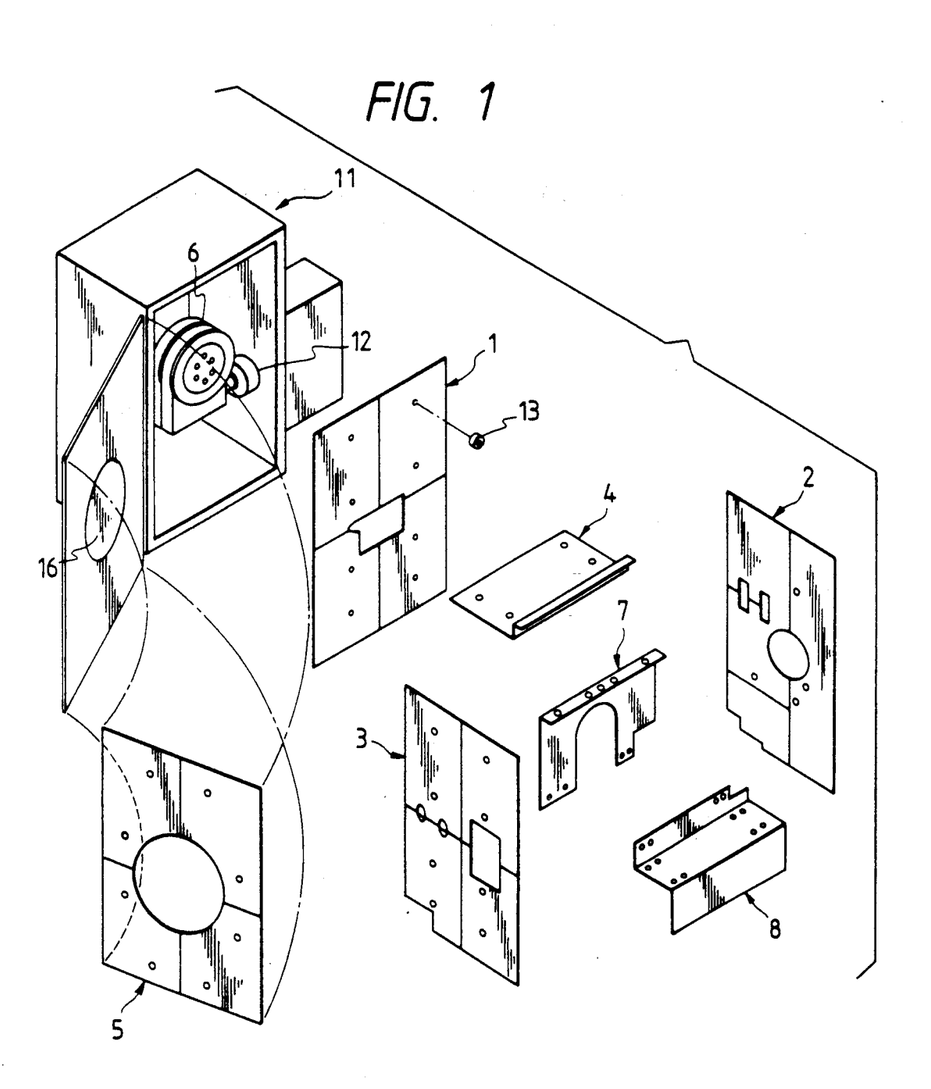
FIG. 1 is a diagramatical illustration of how the deposit shield plates are disposed in the film forming chamber of a conventional film forming apparatus.

On the other hand, the method in which the film forming chamber is equipped on the inside with the deposit shield plates as shown in FIG. 1 has the advantage that the film can be readily prevented from being contaminated without shortening the life of the apparatus, since the deposit shield plate is changed for new one on which no deposits that may cause dusting are adhered, before the substrate or the film in the course of formation is contaminated by dusting. However, as illustrated in FIG. 1, when a set of deposit shield plates is changed for new one, the respective deposit shield plates are unfastened one by one, so that the film forming chamber must be widely opened.

An example of the manner in which the deposit shield plates are disposed is described below with reference to FIG. 1.

FIG. 1 is a schematic view which diagramatically illustrates how the deposit shield plates are disposed in a conventional typical film forming apparatus. In FIG. 1, the numeral 1 denotes a deposit shield plate for the innermost wall surface of a film forming chamber 11; 2, a deposit shield plate for the right side wall surface; 3, for the left side wall surface; 4, for the ceiling wall surface; and 5, for the front side target wall surface. The numeral 6 denotes a holder, holding a substrate (a disc substrate) on which films are formed, which holder is come down by rotating a shaft portion 12 toward the innermost wall side until it comes to a horizontal state, where it holds the disc substrate carried from an open gate (not shown) and is turned to an upright position (in the state shown in FIG. 1) until it faces a target 16, and film formation is carried out in that state on the substrate. The numeral 7 denotes an auxiliary deposit shield plate fixed in the electrical discharge space so that the film deposition on the the substrate holder 6 can be suppressed to a minimum; and 8, a deposit shield plate for the bottom surface of the film forming chamber. The numeral 13 denotes a nut to fasten each deposit shield plate.

Under such construction, the inner wall of the film forming chamber 11 is exposed to air and hence the gases such as nitrogen, oxygen, carbon dioxide and water contained in the air are adsorbed on the inner wall of the film forming chamber 11, so that it has sometimes occurred that it takes a long time until the inside of the film forming chamber 11, when evacuated after the deposit shield plates have been changed, reaches the desired vacuum degree before the film formation is again started.

It has also sometimes occurred, for example, that the surfaces of targets such as metals, polymers or ceramics, or film forming starting materials such as vapor deposition starting materials undergo chemical reaction such as oxidation to cause compositional changes of the film forming starting materials, resulting in compositional changes of the film to be formed. Hence, for the purpose of forming films with the desired composition after the deposit shield plates are changed for new ones, it has been sometimes required to provide a treatment, for example, to remove by sputtering the surfaces of targets having undergone compositional changes or to remove by evaporation the vapor deposition starting materials.

Thus, changing the deposit shield plates for new ones has caused a decrease in the compositional uniformity of films and the operating efficiency of the film forming apparatus.

SUMMARY OF THE INVENTION

Accordingly, a main object of the present invention is to provide a film forming apparatus and a film forming method that have taken account of the above problems.

Another object of the present invention is to provide a film forming apparatus and a film forming method that can achieve a high operating efficiency of the apparatus.

Still another object of the present invention is to provide a film forming apparatus and a film forming method that can prevent contamination of the film forming chamber.

The present invention provides a film forming apparatus for forming a film on a substrate set inside a film forming chamber capable of being evacuated, comprising;

said film forming chamber in which the film is formed on said substrate;

a deposit shield member to prevent deposits from being adhered to the inner wall surface of said film forming chamber;

a vacuum chamber capable of being evacuated and in which said deposit shield member is changed for new one;

an open-shut means provided between said vacuum chamber and said film forming chamber, to keep airtightness between said vacuum chamber and said film forming chamber; and a carrying means to carry said deposit shield member between said vacuum chamber and said film forming chamber.

The present invention also provides a film forming method of forming a film by applying film forming treatment to a substrate set inside a film forming chamber capable of being evacuated, comprising;

opening an open-shut means which maintains airtightness between said film forming chamber and a vacuum chamber capable of being evacuated and in which a deposit shield member which prevents deposits from being adhered on the inner wall surface of said film forming chamber is changed for another, to carry said deposit shield member into said vacuum chamber;

shutting said open-shut means;

opening said open-shut member to carry another deposit shield member into said film forming chamber from the vacuum chamber evacuated, by a carrying means; and shutting said open-shut means;

thereby changing said deposit shield member in said vacuum chamber for said another deposit shield member.

DESCRIPTION OF THE PREFERRED EMBODIMENTS

The present invention will be described below by giving working embodiments and with reference to the accompanying drawings.

Figure 2:
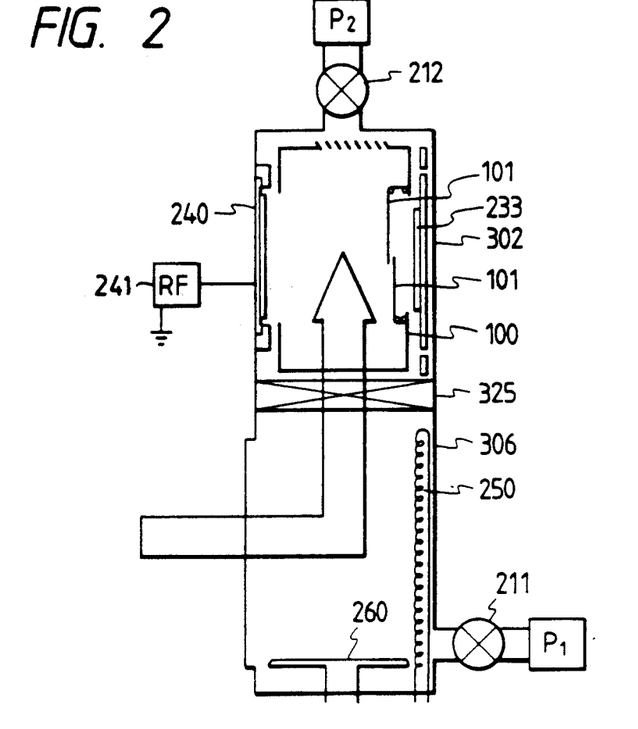
FIG. 2 is a diagramatical illustration of a preferred embodiment of the film forming apparatus of the present invention.

In the first place, FIG. 2 diagramatically illustrates a preferred embodiment of the film forming apparatus of the present invention. The apparatus illustrated in FIG. 2 comprises a target 240, on RF generator 241 a film forming chamber 302, in which a film is formed on a substrate 233, and a vacuum chamber 306, in which a deposit shield member 100 is changed for another, which are disposed interposing an open-shut means 325 for keeping the above film forming chamber 302 and vacuum chamber 306 airtight with each other. The respective chambers are evacuated to the desired pressure by opening or closing the corresponding exhaust valves 211 and 212 of exhaust systems connected to pumps $P_1$ and $P_2$.

The deposit shield member 100 is carried from the vacuum chamber 306 to the film forming chamber 302 and vice versa by means of a carrying means 260 as exemplified by an elevator, rollers, or a chuck.

The open-shut means 325 is opened when the deposit shield member is carried, does not obstruct the carrying of the deposit shield member 100, and is shut when it is not carried, to spatially partition the film forming chamber 302 and vacuum chamber 306.

The constitution and operation of the apparatus will be detailed below.

i) The deposit shield member 100 is set with registration in the vacuum chamber 306 opened to atmospheric pressure.

ii) The exhaust valve 211 is opened to evacuate the inside of the above vacuum chamber 306 to the desired pressure. On this occasion, a baking means 250 may be provided in the vacuum chamber 306 so that the gas in the air, adsorbed on the surface of the deposit shield member 100, may be eliminated in a shorter time. In the vacuum chamber 306, a means for cooling the deposit shield member 100 after the baking may also be provided so that the temperature inside the film forming chamber 302 may not cause undesirable distribution because of the baking that causes a temperature rise of the deposit shield member 100.

iii) The open-shut means 325 is opened, and the deposit shield member 100 is carried from the inside of the vacuum chamber 306 to the inside of the film forming chamber 302 through a known carrying means 260. The deposit shield member 100 is thus set in the film forming chamber 302, and then the open-shut means 325 is shut.

iv) Film formation as described below is carried out so that a film comprising the desired materials may be formed on the substrate 233 set in the evacuated film forming chamber 302.

Figure 3:
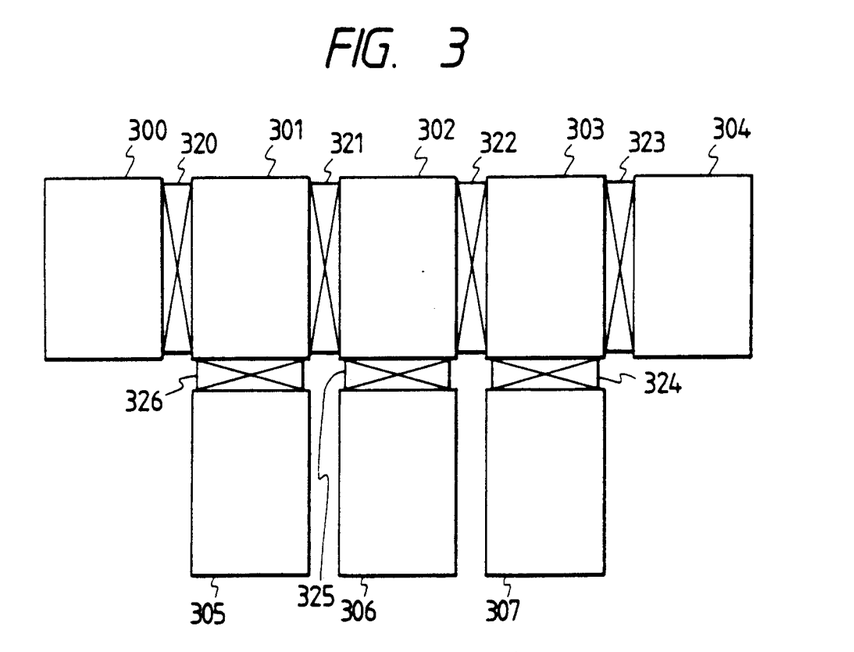
FIG. 3 is a diagramatical illustration of another preferred embodiment of the film forming apparatus of the present invention.

The film forming chamber 302 may be provided in singularity, or in plurality as illustrated in FIG. 3, and, particularly in instances in which a plural layer of films are formed on the substrate, different film forming chambers should preferably be provided respectively for the films to be formed. In the instance where the film forming chamber 302 is provided in plurality, the substrate should preferably be carried between the film forming chambers without breaking the vacuum. A substrate feed chamber 300 and a substrate take-off chamber 304 (see FIG. 3) may also be provided so that the film formation can be continuously carried out on a subsequent substrate after the film formation has been completed once. In this instance, the above feed chamber 300 and take-off chamber 304 should preferably be capable of being evacuated to the same pressure as the inside of the film forming chambers. The above feed chamber may also be provided with a means for heating the substrate to the desired substrate temperature, and also with a means for baking the substrate and the feed chamber.

v) The open-shut means 325 is opened and the deposit shield member 100 is carried from the inside of the above film forming chamber 302 to the inside of the above vacuum chamber 306 before the thickness of the deposits adhered on the inner wall of the deposit shield member 100 as a result of the above film formation reaches the thickness that may cause the peel-off of deposits. Here, the deposit shield member may be carried every time the film formation is completed once, or may be carried after the film formation has been completed several times.

vi) After the above deposit shield member 100 has been carried, the above open-shut means 325 is shut and the pressure in the above vacuum chamber 306 is opened to atmospheric pressure using e.g. dry air, where the above deposit shield member 100 in the vacuum chamber 306 is changed for a new deposit shield member.

In the subsequent procedures, the new deposit shield member is set in the film forming chamber 302 in the same manner as in steps i) to iii).

Figure 4A:
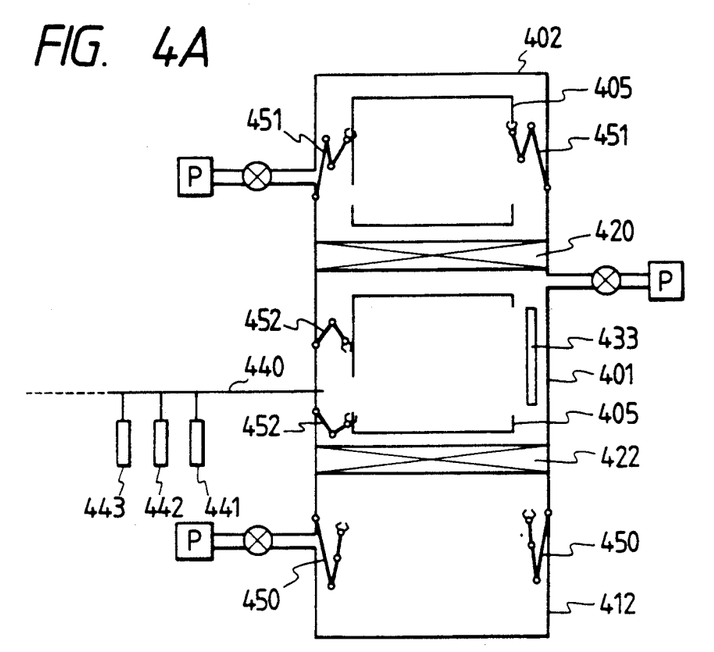
FIGS. 4A and 4B are diagramatical illustrations of still another preferred embodiment of the film forming apparatus of the present invention.

In the embodiment described above, the deposit shield member 100 is changed by utilizing a single vacuum chamber 306, but the present invention is by no means limited to the above embodiment. In order to enhance the operating efficiency of the film forming apparatus to achieve an improvement in the productivity, for example, a vacuum chamber 402 for carrying a deposit shield member 405 into a film forming chamber 401 and also a vacuum chamber 412 for carrying the deposit shield member 405 out of the film forming chamber 401 may also be provided as illustrated in FIG. 4A. The carrying means may also comprise manipulators 450, 451 and 452.

In a more preferred instance, the inside of the film forming chamber 302 and the inside of the vacuum chamber 306 should preferably have a small difference in pressure, preferably have no difference in the pressure, in order to suppress as much as possible the mixing between the atmosphere inside the film forming chamber 302 and the atmosphere inside the vacuum chamber 306, further suppress the compositional scattering of the film formed, further enhance the operating efficiency during the manufacture, and again carry out the film formation even immediately after the deposit shield member 100 is changed for new one.

Similarly, the insides of the respective chambers should preferably have a small difference, and preferably no difference, in the pressure when using the apparatus in which the substrate is carried between adjacent film forming chambers, between the substrate feed chamber and film forming chamber, or between the film forming chamber and substrate take-off chamber.

In carrying the deposit shield member and the substrate as described above, the insides of the chambers between which they are carried should be evacuated to a low pressure, preferably not more than 500 Pa, preferably not more than 2 Pa, and most preferably not more than $6 \times 10^{-3}$ Pa, in order to prevent as much as possible the inner wall of the film forming chamber from being contaminated by the mixing of atmospheres between the chambers.

The film formation in the present invention may be carried out by processes including, for example, sputtering, vacuum deposition, heat CVD, plasma CVD, photo CVD, and ion plating.

The film formed according to the film forming apparatus and film forming method of the present invention may comprise, for example, an inorganic material including metals such as Fe, Ni, Co, Cr, Au, Ag, Cu, Al and Zn, and alloys, carbides, nitrides, silicides, borides, oxides, sulfides or halides of these, or an organic material including polyimide, polyethylene or phenol resins.

Conditions under which the film comprising any of the above materials is formed on the substrate may vary depending on the materials of films and the manners of film formation, but, in the instance of, for example, sputtering, the pressure inside the film forming chamber should preferably range between not less than $3 \times 10^{-2}$ Pa and not more than 10 Pa, preferably between not less than $5 \times 10^{-2}$ Pa and not more than 5 Pa, and most preferably between not less than $8 \times 10^{-2}$ Pa and not more than 3 Pa.

In the instance of, for example, heat CVD, the pressure should preferably range between not less than 1 Pa and not more than $3 \times 10^4$ Pa, preferably between not less than 5 Pa and not more than $8 \times 10^3$ Pa, and most preferably between not less than 10 Pa and not more than $1 \times 10^3$ Pa.

In the instance of, for example, ion plating, it should preferably range between not less than $1 \times 10^{-3}$ Pa and not more than 10 Pa, more preferably between not less than $5 \times 10^{-3}$ Pa and not more than 5 Pa, and most preferably between not less than $2 \times 10^{-2}$ Pa and not more than 1 Pa.

The substrate temperature should preferably range between not less than 30° C. and not more than 800° C., more preferably between not less than 50° C. and not more than 600° C., and most preferably between not less than 80° C. and not more than 500° C.

The deposit shield member used in the present invention will now be detailed below.

Figure 5A:
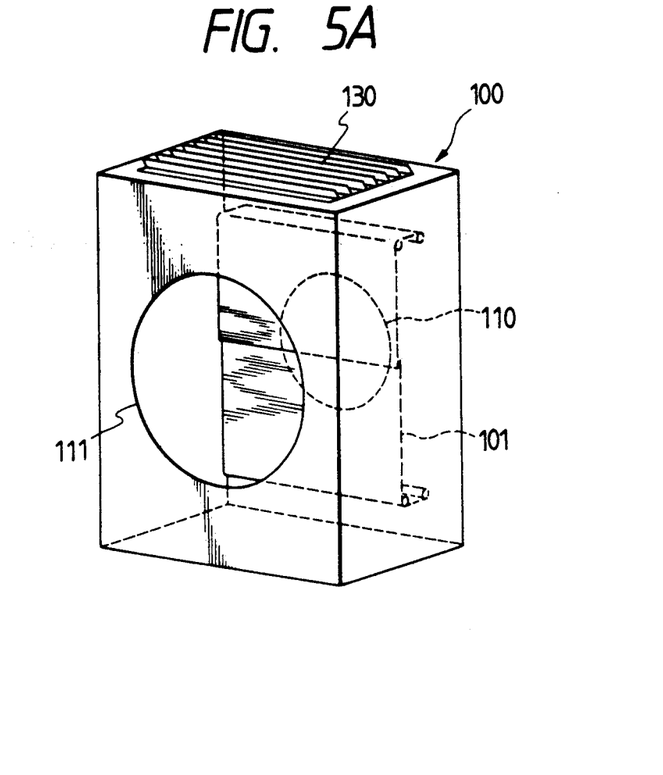
FIGS. 5A and 5B are diagramatical illustrations to show a deposit shield member.
Figure 5B:
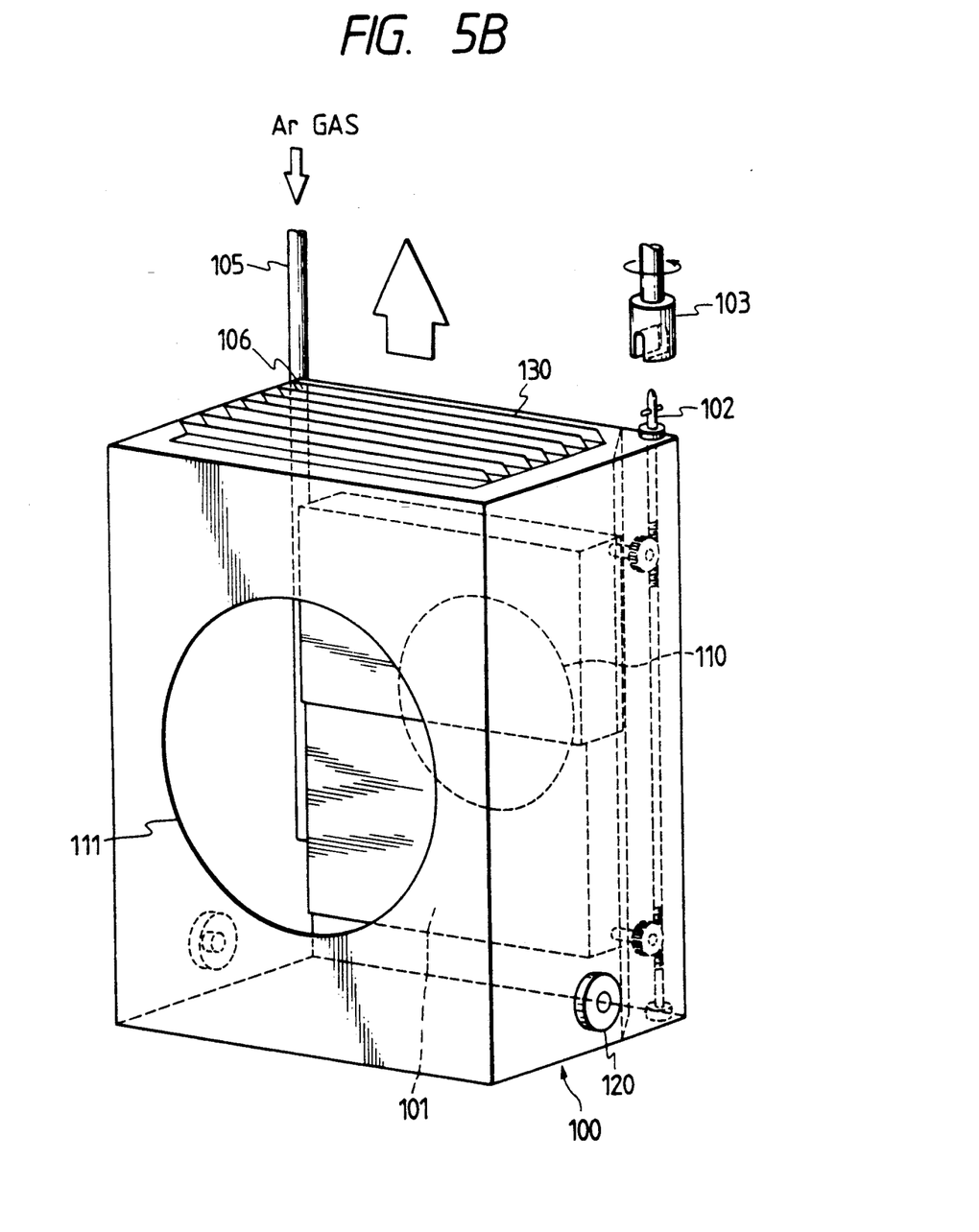

FIGS. 5A and 5B diagramatically illustrate an example of a preferred deposit shield member usable in the present invention.

The deposit shield member used in the present invention differs from the deposit shield plates conventionally used (see FIG. 1) and the members that cover the inner wall surfaces of the film forming chamber are all integrally formed. Hence, as compared with the conventional deposit shield plates in which the members that cover the inner wall surfaces of the film forming chamber are separately unfastened and fastened, the deposit shield member of the present invention can be unfastened at one time and fastened at one time, and thus the present invention can improve the operability in changing the members.

The deposit shield member of the present invention is also provided with a substrate-side opening 110 and a film forming material feed opening 111 so that it can prevent deposits from being formed on the inner wall surface of the film forming chamber but may not prevent the film from being formed on the substrate. Here, the deposit shield member may be further provided with an opening from which a gas for forming an atmosphere as exemplified by an oxidizing atmosphere, a reducing atmosphere and a neutral atmosphere is fed, or may be provided with an opening 106 through which a feeding means 105 is inserted such as a feed pipe for feeding therefrom the atmosphere forming gas.

In addition, the deposit shield member (a deposit shield box) may also be provided with an opening 130 in the vicinity of an exhaust vent of the film forming chamber so that, in evacuating the inside of the film forming chamber, any undesired pressure distribution may not be produced and the pressure inside the deposit shield member may be maintained at a lower exhaustion resistance and in a condition of more uniform reduced pressure. Here, in the instance where the opening 130 is provided in the vicinity of the above exhaust vent, the opening should preferably take the form of, for example, a louver so that, even when fine dust is produced from the vicinity of the exhaust vent at which deposits tend to be formed, it can prevent the dust from invading the deposit shield box and, moreover, the exhaustion resistance can be suppressed to a low level.

A shutter 101, which is opened only when the film formation is carried out and is shut when it is not, may also be provided at the opening of the deposit shield member so that, when the deposit shield member is carried, it can prevent the inside of the film forming chamber from being contaminated by the generation of fine dust. This shutter 101 is opened or shut by, for example, a driving force transmitted to a shutting shaft 102 provided inside the deposit shield box, through means of a driving system 103 provided outside the box.

The deposit shield member may also have a fixing means 120 as exemplified by a hook, a fixing-pin holder, a fixing groove and a fixing plate, to fix the deposit shield member inside the film forming chamber.

As for materials to form the deposit shield member of the present invention, most materials can be used which preferably are not deformed and do not cause any chemical reaction under film forming conditions for carrying out the film formation. Of the above materials, preferably used are metallic materials as exemplified by Mo, Ta and W, having a small thermal expansion coefficient, and which are desirable for further suppressing the peel-off of deposits or the dusting.

In the present invention, the deposit shield member can be changed by utilizing the vacuum chamber 306 as previously described, and the vacuum chamber 306 may be of the type that has been so designed as to receive a plurality of deposit shield members 100. In such an instance, it should preferably have a means for transferring a new deposit shield member 100 to the carrying means 260 for carrying the new member into the film forming chamber 302, and a means for transferring a used deposit shield member 100 from the carrying means 260.

The vacuum chamber may also be constituted of a plurality of chambers. In such an instance, there may be provided with, for example, a feed chamber for the deposit shield member 100, a gas-eliminating chamber, a cooling chamber, a housing chamber for housing a plurality or singularity of deposit shield member(s) before they are or it is carried into the film forming chamber, a carrying chamber having the carrying means 260 for carrying the deposit shield member between the film forming chamber and vacuum chamber, and a take-off chamber in which used deposit shield members are taken off. A regenerating chamber may also be provided in which etching or the like is carried out to remove deposits adhered on the surface of a used deposit shield member so that the deposit shield member can be reused, and in such an instance, the deposit shield member may be regenerated in a closed system so that it can be repeatedly used.

The present invention will be described below by giving Examples with reference to the drawings, but the present invention is by no means limited to the following Examples.

EXAMPLE 1

The film forming apparatus and film forming method of the present invention are described below with reference to FIGS. 2, 3, 5A, 5B and 6.

FIG. 3 illustrates an in-line photomagnetic recording medium film forming apparatus according to the present invention, which forms a multi-layer film of a silicon nitride layer/Tb-Fe-Co layer/silicon nitride layer system on a polycarbonate substrate. The present Example shows an example of the apparatus having a plurality of film forming chambers for the formation of the multi-layer film, but the apparatus of the present invention may also comprise a single film forming chamber.

The numeral 300 denotes a feed chamber for feeding a substrate of the medium, which is a polycarbonate (PC) substrate held on the substrate holder (FIG. 6); 301, a sputtering chamber for the film formation of the silicon nitride layer, which is a protective layer; 302, a sputtering chamber for the film formation of the Tb-Fe-Co layer, which is a recording layer; 303, a sputtering chamber for the film formation of the silicon nitride layer, which is a protective layer similar to 301; and 304, a take-off chamber in which the substrate holder with the treated substrate is collected. The numeral 305 denotes the vacuum chamber (see FIG. 2), into and out of which the deposit shield box (FIGS. 5A and 5B) to be set inside the film forming chamber 301 is carried, and in which the baking is carried out; and 306 and 307, vacuum chambers of the same type, associated with the chambers 302 and 303, respectively. Gate valves 320, 321, 322, 323, 324, 325 and 326 are respectively provided between the chambers to keep the airtightness between chambers. The three film forming chambers 301, 302, and 303 are always evacuated using an evacuation system having an exhaust valve connected to a cryopump, except when the target is changed for another, and other chambers are evacuated by opening or closing exhaust valves and leaked by feeding an atmosphere gas, as occasion calls.

Figure 6:
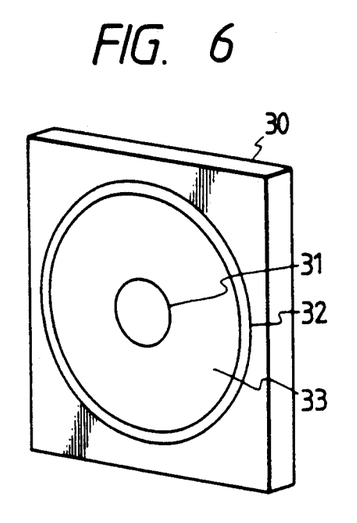
FIG. 6 is a schematic illustration of a substrate holder.

FIG. 6 shows a PC substrate 33 and its holder 30, and an inner periphery mask 31 and an outer periphery mask 32 for masking the central part and outer peripheral part of the substrate.

FIG. 5A schematically illustrates the deposit shield box 100 according to the present invention. A plurality of metallic plates are used in the prior art, but they are integrated in the present invention so as to be readily carried taking the form of a box, which is placed in each film forming chamber 301, 302, 303 when the film formation is carried out.

Film formation procedures will now be described below with reference to FIG. 3. The holder 30 with the PC substrate is put in the feed chamber 300, and subjected to reverse sputtering for exhaustion and elimination of adsorbed gas. Thereafter, the substrate held on the holder is carried into the chamber 301, where the silicon nitride layer of 800 Å thick is formed, and further carried into the chamber 302, where the Tb-Fe-Co layer of 800 Å thick is formed, finally carried into the chamber 302, where the silicon nitride layer of 800 Å thick is formed, and then taken off in the take-off chamber 304 under leak.

FIG. 2 is a cross section showing the film forming chamber 302 and the vacuum chamber 306 used in changing the deposit shield box (The film forming chambers 301 and 303 and the vacuum chambers 305 and 307 are similarly constructed).

Procedures of changing the deposit shield box 100 will be described below with reference to FIG. 2. The vacuum chamber 306 is evacuated by means of the exhaust valve 211, a baking heater 250 is turned on to maintain the inner wall of the chamber at 150° C. for 3 hours, and thereafter the chamber wall is restored to be kept at room temperature by flowing cooling water through a water-cooling pipe (not shown) wound around the outer wall surface of the chamber, followed by sufficient evacuation of the vacuum chamber 306. Thereafter, a gate valve 325 between it and the film forming chamber 302 is opened to carry the deposit shield box in the film forming chamber into the vacuum chamber 306 by using an elevator 260, and then the gate valve 325 is again shut, followed by leaking to take out the deposit shield box 100.

Next, a new deposit shield box is put in the vacuum chamber 306, the inside thereof is evacuated, the baking heater 250 is turned on to maintain the deposit shield box 100 and the inside wall of the chamber at 150° C. for 3 hours in the same way as the instance where the box is taken out. Thereafter, both of them are restored to be kept at room temperature, the gate valve 325 is opened to carry the deposit shield box into the film forming chamber 302, and then the gate valve 325 is shut.

In the above, description has been made in respect of the film forming chamber 302 and vacuum chamber 306, but the deposit shield box is changed in entirely the same procedures also in respect of the film forming chamber 301 and vacuum chamber 305 and in respect of the film forming chamber 303 and vacuum chamber 307.

The constitution of the deposit shield box in the present Example will be specifically described below with reference to FIG. 5B.

FIG. 5B diagramatically illustrates the deposit shield box 100 according to the present Example. This has been made integral so as to be readily carried taking the form of a box, and is placed in each film forming chamber 301, 302, 303 when the film formation is carried out.

In FIG. 5B, the numeral 101 denotes the shutter, capable of being opened or shut when the film formation is carried out, and the shutter is opened or shut by rotating a drive shaft 103 coupled with an open-shut shaft 102 provided at the top surface of the deposit shield box, through means of a driving system provided outside the film forming chamber. The drive shaft 103 is provided inside the film forming chamber, and is coupled with the open-shut shaft 102 when the deposit shield box has been carried into the film forming chamber by means of the elevator 260.

In the same way as the drive shaft 103, an argon gas feed pipe 105 is provided inside the film forming chamber, and is inserted into the deposit shield box from a gas feed pipe inlet 106. The numeral 110 denotes a substrate-side opening; 111, a target-side opening; and 130, a louver for preventing film forming particles from flying out of the exhaust vent.

The numeral 120 denotes a deposit shield box fixing-pin holder. A deposit shield box supporting-fixing pins (not shown) is inserted to this fixing-pin holder from each side of the film forming chamber after the deposit shield box is carried thereinto by means of the elevator 260, thereby fixing the deposit shield box in place in the film forming chamber.

In the following, procedures of film formation will be described with reference to FIG. 3.

The substrate holder 30 (see FIG. 6) with the PC substrate 33 was first fed into the feed chamber 300 shown in FIG. 3. Subsequently the inside of the feed chamber 300 was evacuated and argon gas was fed from a gas feed pipe (not shown), thereby maintaining the pressure inside the above feed chamber 300 to 1.5 Pa.

Next, an RF electric power feed terminal (not shown) was pressed against the above substrate holder 30, and, with application of an electric power of 13.56 MHz and 150 W, the above substrate 33 was subjected to sputtering for 1 minute to carry out treatment for eliminating the gas adsorbed on the surface of the above substrate 33.

Subsequently the feeding of argon gas into the feed chamber 300 was stopped. After the inside of the above feed chamber 300 was evacuated to a pressure of not more than $5 \times 10^{-5}$ Pa, the gate valve 320 between the film forming chamber 301 evacuated to not more than $5 \times 10^{-5}$ Pa and the above feed chamber 300 was opened to carry the substrate holder 30 with the substrate into the above film forming chamber 301.

After it was carried, the above gate valve 320 was shut, and argon gas was fed from the gas feed means 105 into the deposit shield box 100 to keep the pressure inside the film forming chamber 301 at $3 \times 10^{-1}$ Pa.

Next, to an $Si_3N_4$ target for sputtering was applied an RF electric power of 13.56 MHz and 500 W to initiate discharge, and after the discharge state is stabilized, the driving force to open or shut the shutter 101 was transmitted from the drive shaft 103 to the shutter open-shut shaft to make the shutter open, to form an $Si_3N_4$ film with a thickness of 800 Å on the substrate 233.

Subsequently, the shutter was shut, the application of RF electric power was stopped, the feeding of argon gas into the film forming chamber 301 was stopped, and the inside of the above film forming chamber 301 was evacuated to a pressure of not more than $5 \times 10^{-5}$ Pa.

The inside of the film forming chamber 302 was evacuated to a pressure of not more than $5 \times 10^{-5}$ Pa in the same way as the pressure in the above film forming chamber 301, the gate valve 321 was opened to carry the substrate holder 30 with the substrate into the above film forming chamber 302, and then the above gate valve 321 was shut.

Argon gas was fed into the deposit shield box 100 set in the film forming chamber 302 through the gas feed means 105, and the inside of the film forming chamber 302 was maintained at a pressure of $2 \times 10^{-1}$ Pa. Thereafter, an RF electric power of 13.56 MHz and 520 W was applied to a Tb-Fe-Co target used for sputtering, to cause electrical discharge, the shutter was opened as described above to form a Tb-Fe-Co film with a thickness of 800 Å on the substrate 233 on which the above $Si_3N_4$ film had been formed, and then the application of RF electric power was stopped.

The feeding of argon gas into the film forming chamber 302 was stopped, and, in the same way as the above-described procedures of carrying the substrate, the substrate holder 30 with the resulting substrate was carried into the film forming chamber 303 evacuated to not more than $5 \times 10^{-5}$ Pa.

On the substrate 233 carried into the film forming chamber 303, an $Si_3N_4$ film of 800 Å thick was formed in the same manner as the sputtering in the film forming chamber 301.

The feeding of argon gas into the film forming chamber 303 was stopped, the substrate holder 30 with the substrate was carried into the take-off chamber 304 in the same way as the above-described procedures of carrying the substrate, the gate valve 323 was shut, the inside of the above take-off chamber 304 was leaked to atmospheric pressure by use of dry air, and then a closing door (not shown) was opened to take out the substrate holder 30 with the resulting substrate.

Procedures of changing the deposit shield box 100 for another will be described below with reference to FIG. 2.

The deposit shield box 203 was set with registration in the vacuum chamber 306 leaked to atmospheric pressure by use of dry air, the exhaust valve 210 was opened to keep the inside of the vacuum chamber 306 at a pressure of not more than $1 \times 10^{-3}$ Pa, the surface temperature of the above deposit shield box 100 and the inner wall temperature of the above vacuum chamber 306 were raised to 150° C. using the baking heater 250 for eliminating the gas adsorbed on the wall surface of the above deposit shield box 100 and the vacuum chamber 306, and baking was carried out for 3 hours.

Cooling water was flowed in a water-cooling pipe (not shown) wound around the outer wall of the vacuum chamber 306, to cool the inner wall of the vacuum chamber 306 to room temperature.

The insides of the vacuum chamber 306 and film forming chamber 302 were evacuated to a pressure of not more than $5 \times 10^{-5}$ Pa, and the gate valve 325, an open-shut means, was opened to carry the deposit shield box 100 from the above vacuum chamber 306 into the film forming chamber 302 by means of the elevator 260, which is a means for carrying the deposit shield box 100.

The above deposit shield box 100 was fixed inside the film forming chamber 302 by means of the fixing pin (not shown), which is a fixing member in the film forming chamber 302.

After the film formation was carried out as previously described, on the substrate 233 set inside the film forming chamber 302, the deposit shield box 100 in the film forming chamber 302 was carried into the vacuum chamber 306 following the procedures reverse to the above-described procedures of carrying and fixing the deposit shield box, the gate valve 325 was shut, the inside of the above vacuum chamber was leaked to atmospheric pressure by use of dry air, the deposit shield box 100 in the above vacuum chamber 306 was changed for a new deposit shield box 100 having clean surface, and thus the deposit shield box 100 in the vacuum chamber 306 was changed following the above-described procedures of baking, carrying and fixing the deposit shield box.

The above are the procedures of carrying out the film formation and changing the deposit shield box with use of the in-line sputter film forming apparatus of the present Example. According to this method, long-time evacuation of film forming chambers, surface oxidation of targets and presputtering for removing hygroscopic layers were not required, which have been hitherto required because of the leaking of the film forming chambers. Even in the film formation immediately after the operation to change the deposit shield box was completed, it was possible to carry out film formation to obtain discs having entirely the same characteristics as the discs having sufficiently good film quality, which have films free of any contamination caused by the deposits remaining immediately before change and have characteristics such as adhesion, refractive index and Curie temperature.

Figure 7A:
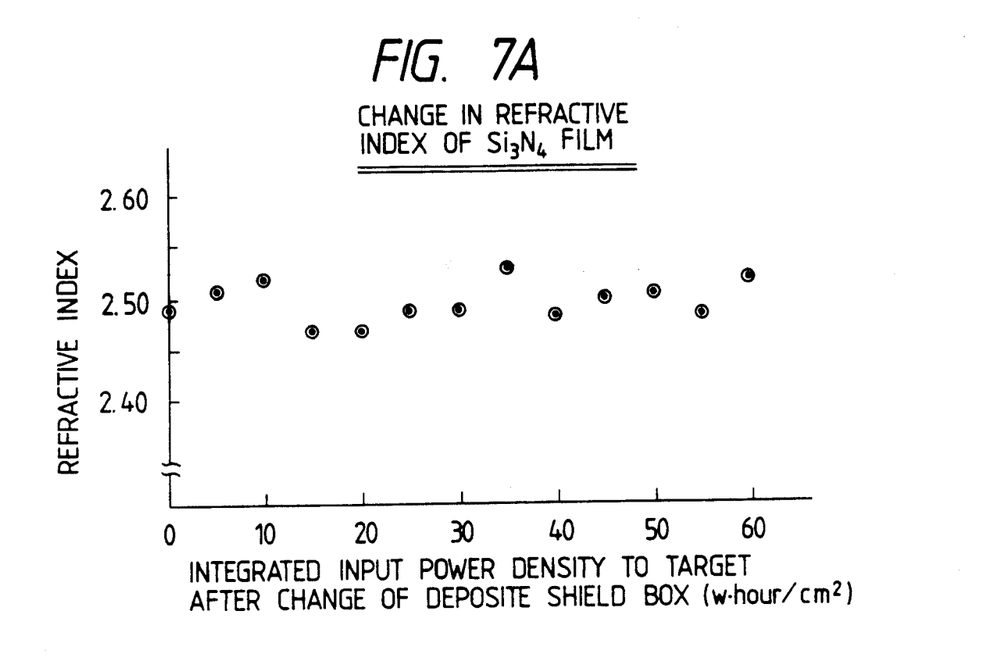
FIGS. 7A and 7B are graphs to show characteristics of films obtained.

Specifically, the film quality of the silicon nitride film was evaluated based on the variation of the refractive index, whose values subtly vary owing to the contamination of films. As a result, as shown in FIG. 7A, it showed a high refractive index of about 2.49 immediately after change of the deposit shield box, and stably retained this refractive index.

Figure 7B:
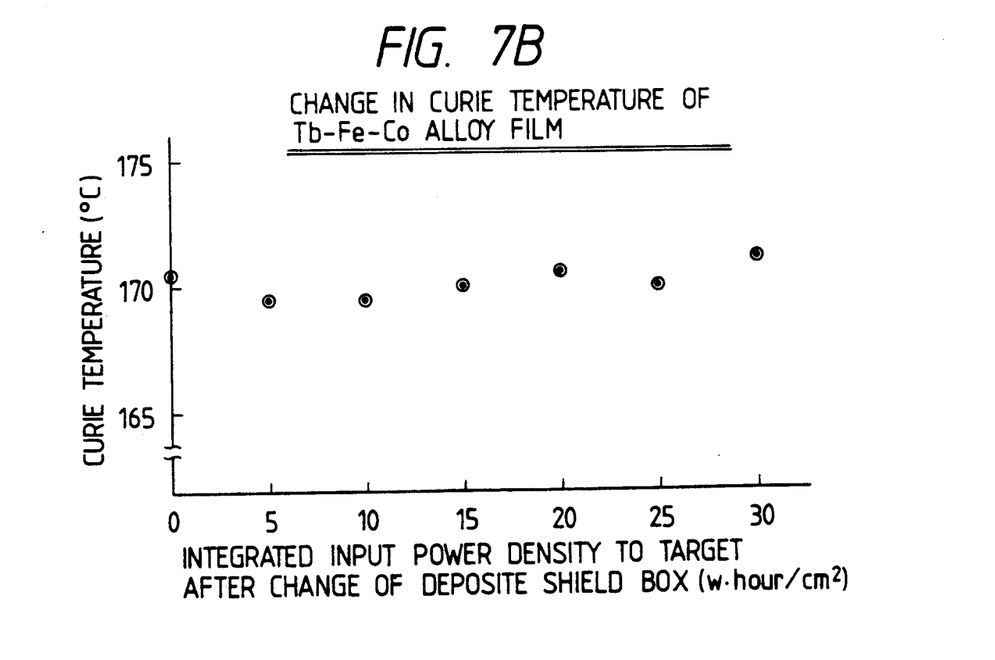

The film quality of the Tb-Fe-Co alloy film was also evaluated based on the variation of the Curie temperature, whose values subtly vary owing to the contamination of films. As a result, as shown in FIG. 7B, it retained a stable Curie temperature of about 170° C. immediately after change of the deposit shield box. Thus, the contamination of films, caused by changing the deposit shield member, was not seen in both the above silicon nitride film and the above Tb-Fe-Co alloy film.

COMPARATIVE EXAMPLE 1

Example 1 was repeated to carry out film formation, except that the deposit shield box was changed by leaking the film forming chamber to atmospheric pressure.

The contamination caused by changing the deposit shield box for another was not seen in the films formed. However, unless, after change, the evacuation was carried out for 20 hours, and thereafter the presputtering, for 2 hours using a usual film formation power, a lowering of the refractive index and a lowering of the adhesion to the PC substrate were caused in the silicon nitride films, and a lowering of the Curie temperature was not recovered in the Tb-Fe-Co film.

EXAMPLE 2

Figure 4B:
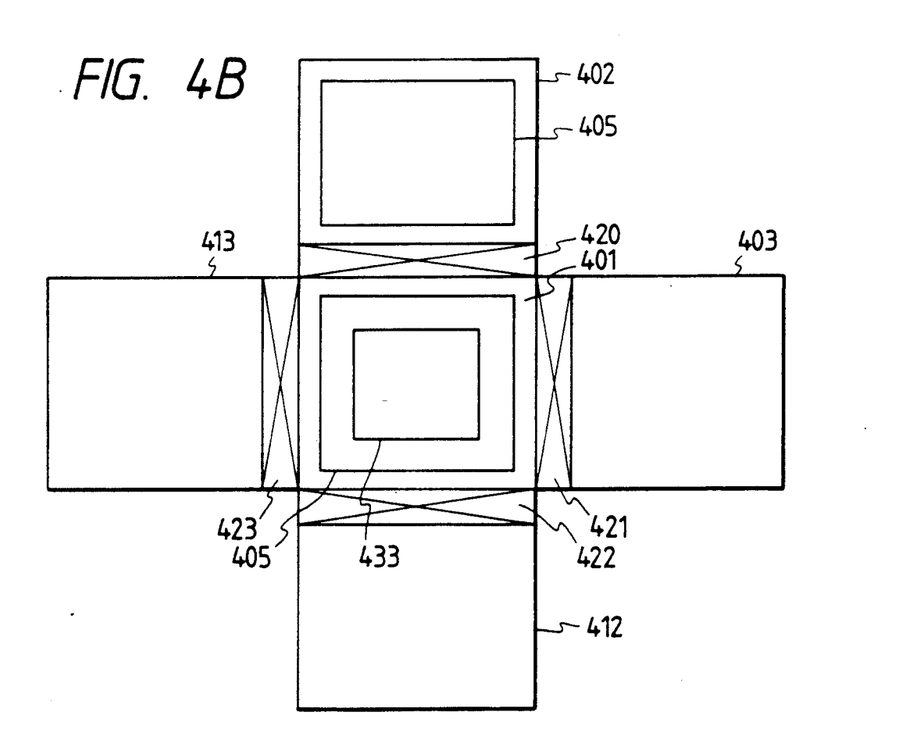

The film forming apparatus illustrated in FIGS. 4A and 4B comprises a film forming chamber 401 capable of being evacuated, a vacuum chamber 402 capable of being evacuated and through which a deposit shield member 405 is carried into the above film forming chamber 401, a vacuum chamber 412 capable of being evacuated and through which the above deposit shield member 405 is carried from the above film forming chamber 401, a feed chamber 403 capable of being evacuated and through which a substrate 433 is fed into the film forming chamber 401 without breaking the vacuum inside the film forming chamber 401, a take-off chamber capable of being evacuated and through which the substrate 433 is taken off from the film forming chamber 401 without breaking the vacuum inside the film forming chamber 401, gate valves 420 to 423, which are open-shut means for keeping the airtightness of the respective chambers, and manipulators 450, 451 and 452 that carry and fix the deposit shield member.

The substrate 433 is so set as to be heated with a substrate heater (not shown) to a desired temperature, and an RF electric power can be applied between the above deposit shield member 405 and the above substrate 433 to form plasma. Gas used for forming the atmosphere and gaseous film forming materials are fed from gas supply means 441, 442 and 443 into the film forming chamber 401 through a gas feed means 440.

Procedures of forming films will be described below.

The feed chamber 403 and film forming chamber 401 were evacuated to a pressure of $10^{-5}$ Pa, the gate valve 421 was opened to carry the substrate 433 into the film forming chamber 401, the gate valve 421 was shut, helium was fed from the gas supply means 443 into the film forming chamber 401 through the gas feed means 440, and the inside of the film forming chamber 401 was kept at a pressure of 0.8 Pa.

Next, the substrate 433 comprising an aluminum sheet of 10 cm square was maintained at 280° C. by the substrate heater, silane ($SiH_4$) gas and disilane ($Si_2H_6$) gas were fed from the gas supply means 441 and 442 in the flow rate ratio of 50:1, the inside of the film forming chamber 401 was kept at a pressure of 0.01 Pa, and an RF electric power of 13.56 MHz and 60 W was applied between the substrate 433 and deposit shield member 405 to generate plasma, thereby forming an amorphous silicon film of 8 μm thick on the substrate 433.

After the film formation was completed, the application of RF electric power was stopped, the feeding of the gases that had been fed into the film forming chamber 401 was all stopped, the insides of the film forming chamber 401 and take-off chamber 413 were evacuated to a pressure of $2 \times 10^{-4}$ Pa, the gate valve 423 was opened to carry the substrate 433 into the take-off chamber 413, the gate valve 423 was shut, the pressure inside the take-off chamber 413 was leaked to atmospheric pressure, and then the substrate on which the amorphous silicon film was formed was taken out.

Subsequently, the vacuum chamber 412, and the vacuum chamber 402 in which the deposit shield member having been subjected to baking was set, were evacuated to $2 \times 10^{-4}$ Pa, the gate valve 422 was opened to carry the deposit shield member 405 into the vacuum chamber 412 by means of the manipulator, the gate valve 420 was opened after the gate valve 422 was shut, to carry the deposit shield member 405 into the film forming chamber 401 by means of the manipulator and fix it therein, and then the gate valve 420 was closed.

The above procedures were repeated to continuously form amorphous silicon films of 8 μm thick on aluminum sheets while the deposit shield member 405 was changed for another every time the film formation was carried out once. The film forming apparatus of the present Example was able to shorten the time taken for changing the deposit shield member 405, and, moreover, was free from either the contamination caused by exposing the inner wall of the film forming chamber 401 to the atmosphere and the contamination caused by the peeling of the deposits on the inner wall of the film forming chamber 401, so that it was possible to enhance the operating efficiency of the apparatus, and also continuously form a large quantity of films with uniform composition without any compositional scattering ascribable to the contamination, and free of any surface roughness ascribable to the contents.

EXAMPLE 3

Figure 8:
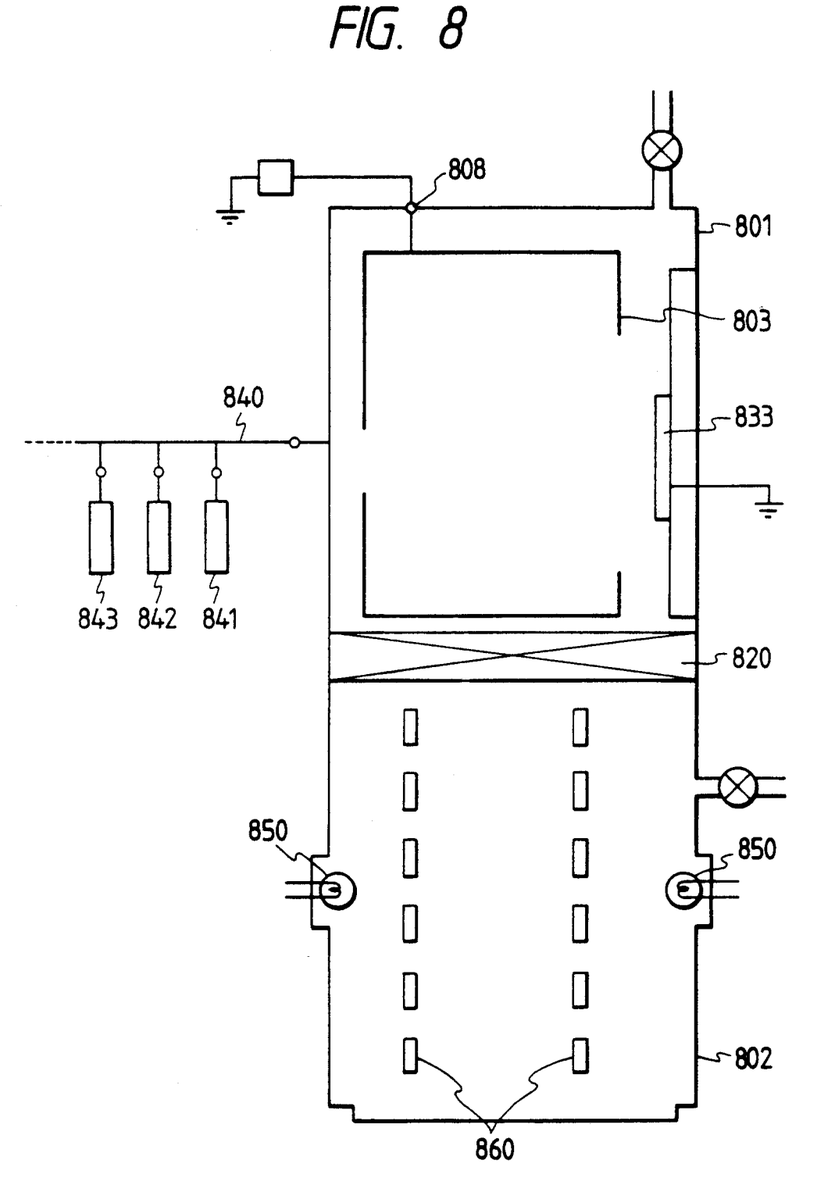
FIG. 8 is a diagramatical illustration of still another preferred embodiment of the film forming apparatus of the present invention.

The film forming apparatus illustrated in FIG. 8 comprises a film forming chamber 801 capable of being evacuated and in which a substrate 833 for forming a film thereon has been set, a deposit shield member 803 for preventing deposits from being adhered on the inner wall of the above film forming chamber 801, a vacuum chamber 802 in which the deposit shield member 803 is changed, a gate valve 820 as an open-shut means between the above film forming chamber 801 and the above vacuum chamber 802, and rollers 860 for carrying the above deposit shield member.

Gas supply means 841, 842 and 843 to supply gaseous film forming materials into the film forming chamber 801, a gas feeding means to feed the above gaseous film forming materials, and an electric source to apply an electric power between the substrate 833 and deposit shield member 803, are connected to the film forming chamber 801.

Using the above apparatus shown in FIG. 8, a PIN type amorphous silicon photovoltaic device was formed according to the following procedures.

The deposit shield member 803 was fed with registration into the vacuum chamber 802 leaked to atmospheric pressure by use of dry air, the inside of the vacuum chamber 802 was evacuated to $2 \times 10^{-4}$ Pa, and then halogen lamps 850, which are heating means for baking, were turned on for 2 hours to carry out gas eliminatron treatment by baking.

Next, the inside of the film forming chamber 801 was evacuated to $2 \times 10^{-4}$ Pa, the gate valve 820 was opened to carry the deposit shield member 803, made of aluminum, into the film forming chamber 801 by means of rollers 860, which are carrying means, and then the gate valve 820 was shut. Here, the deposit shield member 803, when carried into the film forming chamber 801, is brought into electrical contact with a electric power feed pin 808 used for generating plasma to function also as a discharge electrode.

Next, SiH$_4$, B$_2$H$_6$ (diluted to 80 ppm with argon gas) and H$_2$ were fed into the film forming chamber in the flow rate ration of 1:2:6 through the gas feed means 840, the inside of the film forming chamber 801 was maintained at a pressure of $7 \times 10^{-3}$ Pa, and then an electric power of 13.56 MHz and 70 W was applied between the deposit shield member 803 and substrate 833, thus forming a P-type hydrogenated amorphous silicon layer of 900 Å thick.

Subsequently the insides of the film forming chamber 801 and vacuum chamber 802 were evacuated to a pressure of $1 \times 10^{-3}$ Pa, and the deposit shield member 803 was carried into the vacuum chamber 802 in the manner reverse to the above procedures of carrying the same.

The above deposit shield member 803 was changed for a new deposit shield member 803, subjected to the gas elimination treatment described above, carried into the film forming chamber, and set therein.

Next, SiH$_4$ and H$_2$ were fed into the film forming chamber in the flow rate ratio of 2:7 in the same way as previously described, to form an I-type hydrogenated amorphous silicon layer of 1.1 μm thick under conditions of $7 \times 10^{-3}$ Pa, 13.56 MHz and 70 W.

Subsequently, after the deposit shield member 803 was changed for a new deposit shield member 803 following the procedures previously described, SiH$_4$, PH$_3$ (diluted to 100 ppm with helium gas) and H$_2$ were fed into the film forming chamber 801 in the flow rate ratio of 2:3:5, to form an N-type hydrogenated amorphous silicon layer of 1,000 Å thick under conditions of $7 \times 10^{-3}$ Pa, 13.56 MHz and 65 W.

After the feeding of SiH$_4$, PH$_3$ and H$_2$ gases was stopped, (CH$_3$)$_3$In (diluted with He) and oxygen gas were fed into the film forming chamber 801, thereby forming an In$_2$O$_3$ transparent electrode under conditions of 70 Pa, 13.56 MHz and 50 W.

The photovoltaic device thus formed was free from any inclusion into films, of fine dust generated by the peeling of deposits on the inner wall of the film forming chamber, comprised films with uniform composition without any contamination caused by the atmosphere and the deposits on the inner wall of the film forming chamber, and had a high sensitivity and uniform photoelectric characteristics.

I claim:

1. A film forming apparatus for forming a film on a substrate set inside at least one film forming chamber capable of being evacuated, comprising;

said film forming chamber in which the film is formed on said substrate;

a deposit shield member to prevent deposits from being adhered on the inner wall surface of said film forming chamber, said deposit shield member subject to absorption of gas on surfaces thereof;

at least one vacuum chamber capable of being evacuated and in which said deposit shield member is changed for a new one, wherein said vacuum chamber includes a baking means to enhance elimination of gas absorbed on said surface of said deposit shield member;

an open-shut means provided between said vacuum chamber and said film forming chamber, to keep airtightness between said vacuum chamber and said film forming chamber; and a carrying means to carry said deposit shield member between said vacuum chamber and said film forming chamber.

2. The film forming apparatus according to claim 1, wherein said vacuum chamber includes a cooling means.

3. The film forming apparatus according to claim 1, wherein said film forming chamber comprises a plurality of film forming chambers.

4. The film forming apparatus according to claim 1 wherein, said deposit shield member is integrally formed.

5. The film forming apparatus according to claim 1 wherein, said deposit shield member comprises an opening on the substrate side.

6. The film forming apparatus according to claim 1, wherein each of said film forming chambers is connected to a corresponding one of said vacuum chambers, and wherein said deposit shield member is carried from each of said film forming chambers, into one of said vacuum chambers and from said one of said vacuum chambers into said film forming chamber.

7. The film forming apparatus according to claim 1, wherein said at least one vacuum chamber comprises a first and second vacuum chamber each connected to said film forming chamber, said first vacuum chamber having the function of carrying a deposit shield member into said film forming chamber and the second vacuum chamber having the function of carrying a deposit shield member out of said film forming chamber.

* * * * *